United States Patent [19]
Babin et al.

[11] Patent Number: 5,075,638
[45] Date of Patent: Dec. 24, 1991

[54] STANDBY SYSTEM FOR A FREQUENCY SYNTHESIZER

[75] Inventors: David C. Babin, Austin, Tex.; John D. Hatchett, Scottsdale, Ariz.

[73] Assignee: Motorola, Inc., Schaumburg, Ill.

[21] Appl. No.: 633,867

[22] Filed: Dec. 26, 1990

[51] Int. Cl.⁵ .............................................. H03L 7/00
[52] U.S. Cl. .................................... 331/1 A; 331/11; 331/25
[58] Field of Search ............ 331/1 A, 11, 25, DIG. 2; 455/343; 328/14

[56] References Cited

U.S. PATENT DOCUMENTS

| | | | |
|---|---|---|---|
| 4,030,045 | 6/1977 | Clark | 331/25 X |
| 4,951,005 | 8/1990 | Babin et al. | 331/16 |
| 4,968,950 | 11/1990 | Babin et al. | 331/25 X |

OTHER PUBLICATIONS

Seimens Data Sheet TBB 200 PLL Frequency Synthesizer.

*Primary Examiner*—Robert J. Pascal
*Attorney, Agent, or Firm*—Paul J. Polansky

[57] ABSTRACT

A synthesizer is placed in standby mode when a standby portion of a control register is set. Once standby is activated, any detectors and counters are inhibited. The inputs and outputs are reconfigured so as to minimize current drain and to stabilize the VCO control voltage. Recovery from standby is accomplished in two phases. The first phase is started by the receipt of a terminate standby signal. This enables the inputs and starts the counters. The second phase is activated when a signal is received from a feedback counter indicating it has completed a cycle. This causes the preset data to be loaded into the reference counter. The counters are then synchronized; the detector is initialized; and the detector output is enabled. The device also controls an output lock detector and reference frequency signal during the standby mode. The system is also compatible with variable modulus prescalers.

16 Claims, 3 Drawing Sheets

STANDBY SYSTEM FOR A FREQUENCY SYNTHESIZER

FIELD OF THE INVENTION

The present invention relates, in general, to frequency synthesizers and, more particularly, to a standby system for a frequency synthesizer.

BACKGROUND OF THE INVENTION

The concept of phase locked loops (PLLs) dates back to the 1930's where it was used in radar synchronization and other communications applications. Today, PLLs are used in satellite communications systems, navigation systems, computers, cellular communication systems, and radio systems in general.

Radio Frequency (RF) synthesizers are commonly utilized substitutes for crystal controlled transmitter/receiver oscillators. A combination of a master oscillator signal with a secondary signal in a suitable phase detector can provide the choice of a number of controlled frequencies. If a variable frequency oscillator is used with a digital frequency synthesis technique, a virtually unlimited number of stable discrete frequencies directly related to the frequency of the master oscillator are available.

A synthesizer generally makes use of a phase-locked loop (PLL) which also includes a voltage controlled oscillator (VCO), a reference oscillator, a loop filter, and a phase detector. In addition, the synthesizer will also include one or more programmable or switchable multipliers or dividers so the loop can be locked to various multiples of the reference source frequency or one of its subharmonics.

A common use for these synthesizers is in the area of communication equipment, such as RF modems and radio communication devices. This area also involves the increasing use of portable or mobile battery powered radio communication equipment, such as cellular type radio-telephone equipment.

One problem which arises is the limited battery power available for the portable hand-held type of units. It has been found that during normal operation, the synthesizer requires substantial power to operate. Portable radios are frequently designed to operate efficiently for an eight-hour duration on some predetermined duty cycle designating the percentage of time which would be used to receive, transmit, and remain on standby. For example, a 5-5-90 would represent a 5% receive, 5% transmit, and 90% standby. As can be seen, such a radio spends the majority of its time in a standby mode.

To address the power problem, some units have been designed with the capability to disconnect the synthesizer, or portions thereof, from the power supply while in standby. This disconnect may be done on a duty cycle basis, requiring the synthesizer to perform many cycles of active/inactive (standby) operation during the equipment's standby mode. However, when these functions are reactivated, the VCO signal must restabilize before it is usable. During reactivation the PLL signal to the VCO can actually cause the VCO signal to drift away from the desired frequency before restabilizing.

To resolve this problem, the prior art has provided various means of inhibiting portions of the synthesizer until the signals are stabilized. However, this results in a delay to suitable operation and possible loss of data.

Therefore, there still exists a need in the industry for a device and method of saving battery power while at the same time avoiding delays in reestablishing a signal lock.

SUMMARY OF THE INVENTION

The present invention consists of a frequency synthesizer having a reference counter, a divide by N counter, an A counter, a phase/frequency detector, standby sequence logic, and user addressable registers. In addition, control logic is included to control a prescaler in the feedback loop and an additional phase/frequency detector and lock detector may also be provided. The outputs of the reference oscillator, R counter, N counter, phase/frequency detectors, and lock detector are controllable by the C and a portion of the R registers.

When in standby mode, the A, N, and R counters are inhibited from receiving clock signals; the outputs of the phase detectors are set to provide a no error signal state; and a capacitive load is provided at the reference and feedback inputs. During standby, data is retained in A, C, and R registers.

In recovery, the reference and feedback signals are reestablished to their respective counters and the counters are activated. Output from the reference counter is inhibited from reaching the phase detector until an output signal is received from the N counter. At this time, the R counter is loaded from the R register putting the counters in sync. The phase/frequency and lock detector are also initialized at this time.

DETAILED DESCRIPTION OF THE DRAWINGS

Figure 1:
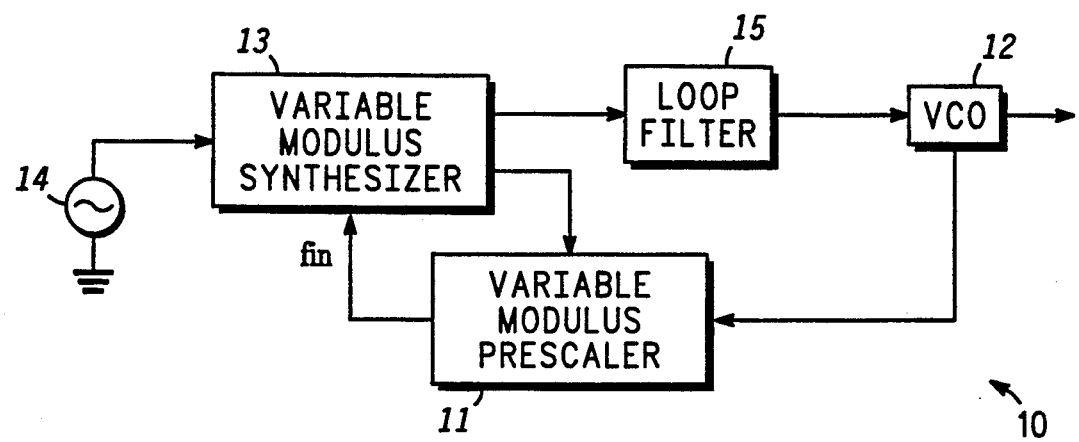
FIG. 1 is a general block diagram of a phase locked loop frequency synthesizer.

Referring initially to FIG. 1, a block digram, generally designated 10, of a phase locked loop frequency synthesizer is illustrated. PLL synthesizer 10 consists of a variable modulus prescaler 11 which divides the output frequency of a voltage controlled oscillator 12 to a predetermined frequency. A variable modulus synthesizer 13 is provided for dividing an output frequency of a reference oscillator 14 and a variable modulus prescaler 11; and comparing the divided reference output to the divided prescaler output in a phase comparator. The output of synthesizer 13 is then filtered in loop filter 15 and transmitted to VCO 12 to control the frequency/phase thereof.

Figure 2:
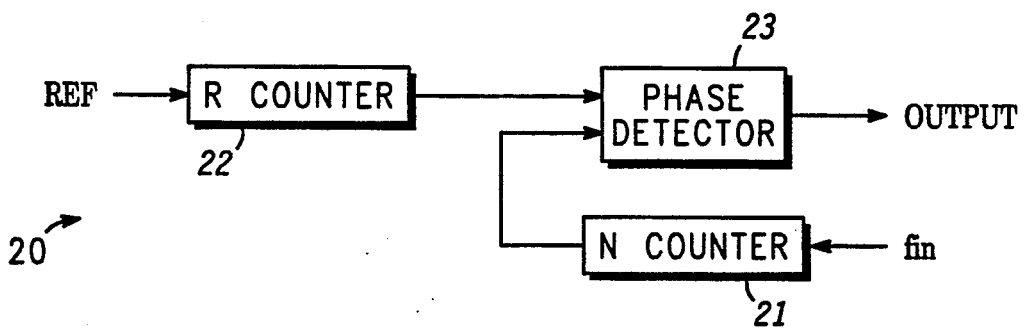
FIG. 2 is a general block diagram of a prior art synthesizer of a phase locked loop frequency synthesizer.

Referring now to FIG. 2, a block diagram of a prior art synthesizer, generally designated 20, is illustrated. Synthesizer 20 consists of an N (feedback) counter 21 which receives the feedback signal from the VCO, generally through a prescaler. Synthesizer 20 also consists of an R (reference) counter 22 which receives a reference signal. The outputs of the R and N counters, are transmitted to a phase detector 23 where they are compared. If the signals are out of phase, a corrective output signal is transmitted from phase detector 23 to the VCO.

Figure 3:
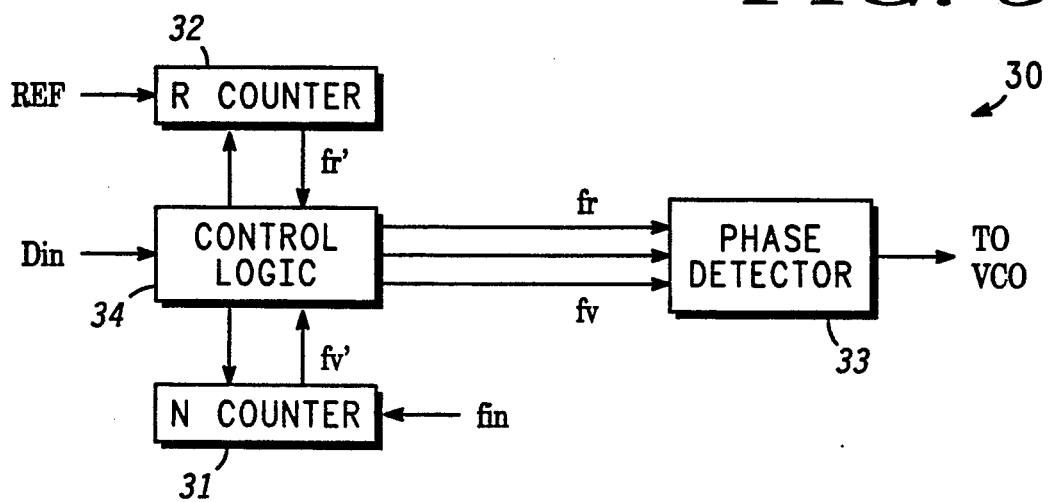
FIG. 3 is a general block diagram of a synthesizer of a phase locked loop frequency synthesizer embodying the present invention.

A more detailed block diagram of a synthesizer, generally designated 30, embodying the present invention is illustrated in FIG. 3. In addition to having an N (feedback) counter 31, an R (reference) counter 32, and a phase detector 33, synthesizer 30 also comprises a control logic circuit 34. Here logic control 34 is coupled to counters 31 and 32 to pass the data used to preset the counters and to synchronize the counters when terminating standby. Logic 34 is also coupled to phase detector 33 to control its output functions and its input signals when terminating standby.

When in a standby mode, control logic 34 will inhibit the clock inputs to counters 31 and 32; shut down one or both of their input buffer amplifiers; and shut down phase detector 33 thereby conserving battery power.

Figure 4:
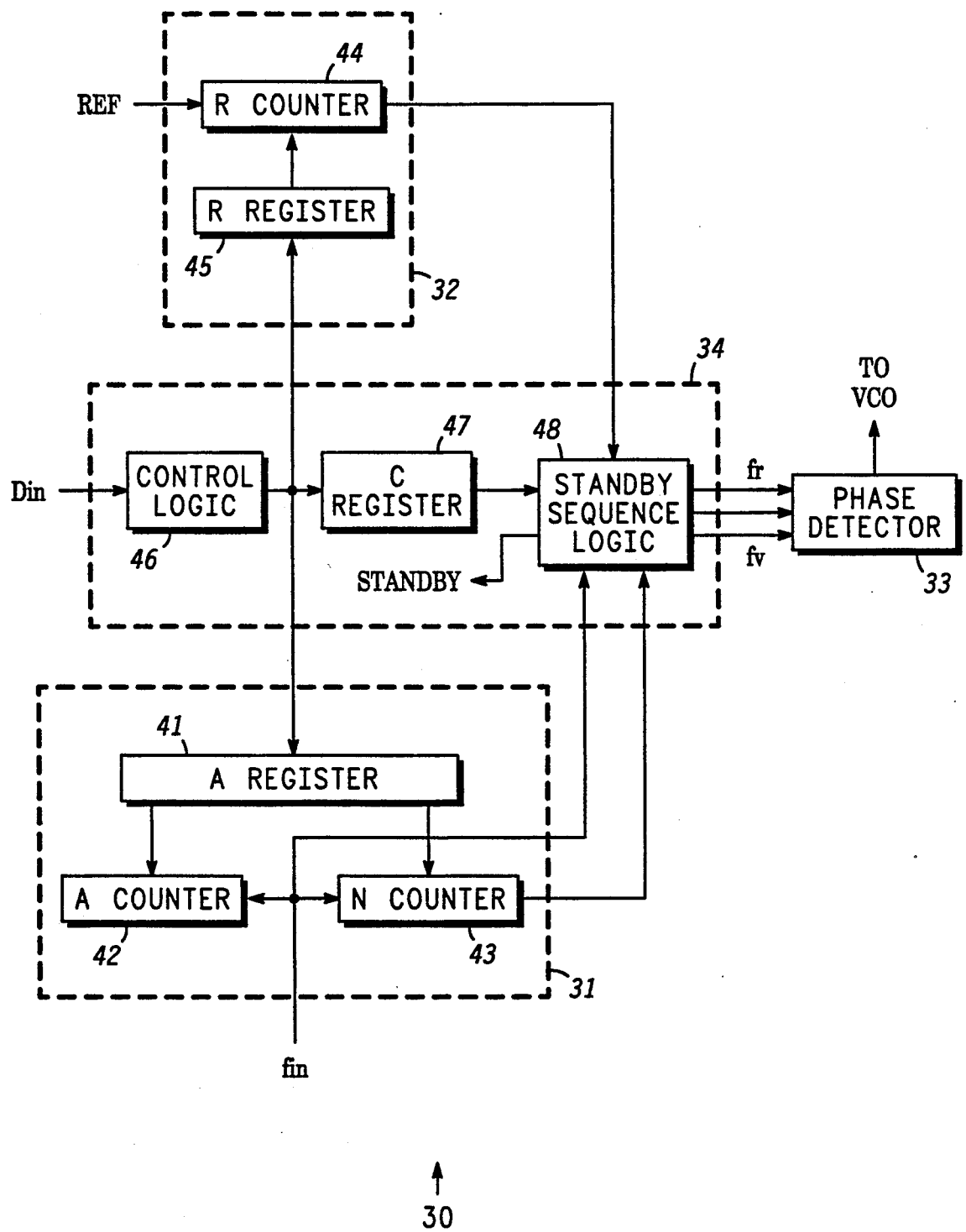
FIG. 4 is a block diagram of a first embodiment of a synthesizer embodying the present invention.

Referring now to FIG. 4, a more detailed block diagram of synthesizer 30 is provided. A reference signal is provided to R counter 32 which is comprised of an R counter 44 and a R register 45. The R register 45 is used to retain the preset data input to synthesizer 30 through a control logic circuit 46. Control logic 46 also provides preset data to N counter 31. N counter 31 consists of an A counter 42, an N counter 43, and an A register 41 for storing the preset data from logic 46.

Control logic 34 also contains a C register 47. C register 47 is provided with data to control several functions of synthesizer 30 including the standby mode. This will be discussed in more detail below. The C register provides a control output to a standby sequence logic 48. The standby sequence logic provides reference ($f_r$) and feedback ($f_v$) signals and a control output to phase detector 33 and also provides a standby signal to other system functions.

When the standby bit of C register 47 is set, the operation of phase detector 33 is inhibited. In addition, the standby signal acts to inhibit the Ref and $f_{in}$ signals to their respective counters.

Figure 5:
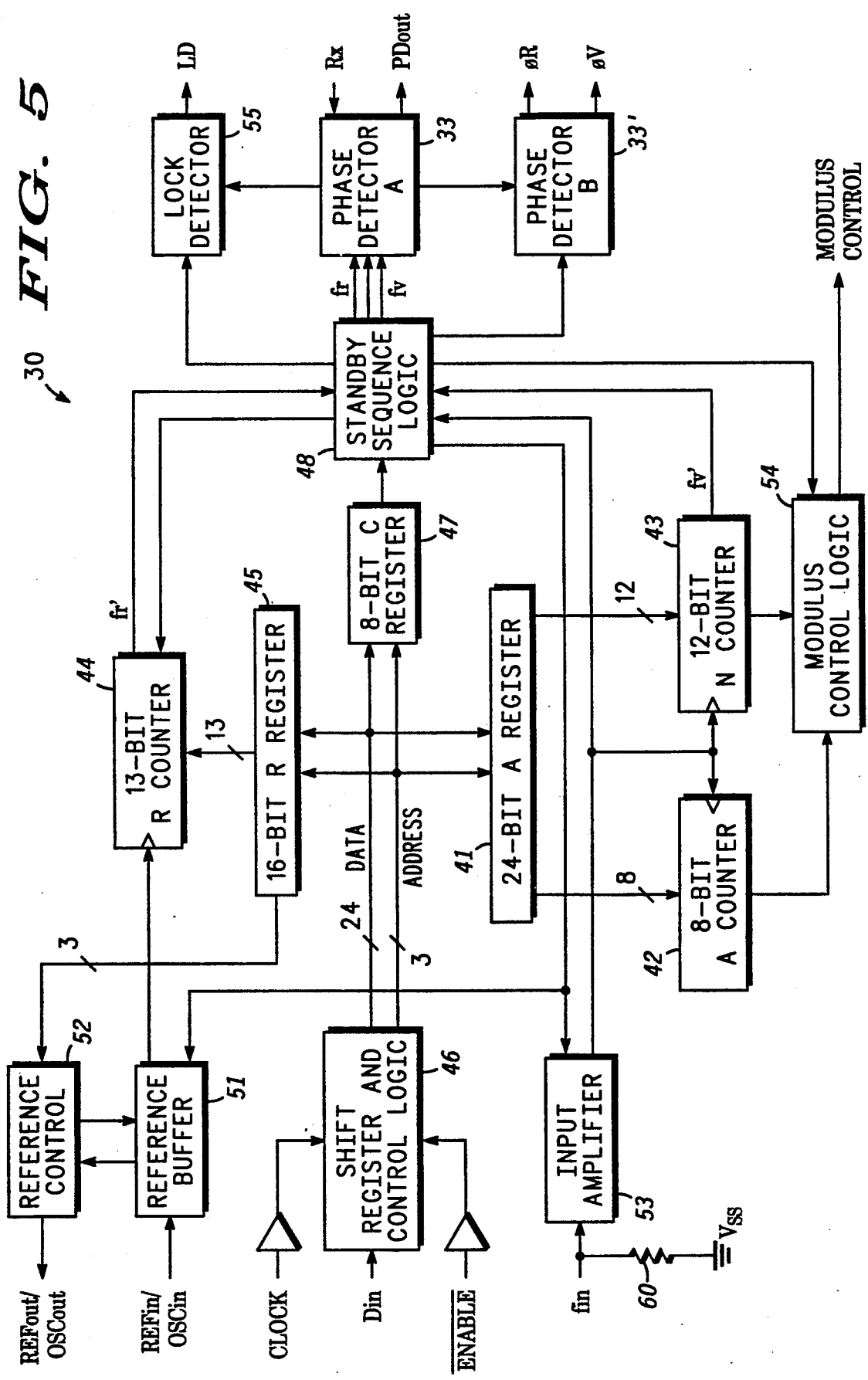
FIG. 5 is a detailed block diagram of the synthesizer of FIG. 4.

In FIG. 5, a detailed block diagram of synthesizer 30 is provided. A reference buffer 51 has been added to receive the REF$_{in}$ signal from an oscillator. Buffer 51 has a control input from standby sequence logic 48 and a control input form a reference control 52. The reference signal from buffer 51 may be provided to both R counter 44 and reference control 52. Reference control 52 operates to provide reference output signal (REF$_{out}$). This signal may be adjusted according to a control signal from R register 45.

The $f_{in}$ input from the prescaler is provided to an input amplifier 53 before being passed to counters 42 and 43. The amplified $f_{in}$ signal is also passed to standby logic 48 to be used in the process of terminating standby. Amp 53 also has a control input from standby sequence logic 48. Outputs from counters 42 and 43 are provided to a modulus control logic circuit 54 which has an output used to control the prescaler counter. Modulus control logic 54 also has a control input provided by standby sequence logic 48.

Synthesizer 30 of FIG. 5 also contains a pair of phase detectors, phase detector A (33) and phase detector B (33'). Phase detector A (33) receives inputs $f_r$ and $f_v$ from counters 43 and 44 via standby sequence logic 48 and a control input directly from logic 48. The $f_r$ and $f_v$ inputs are compared in detector 33 and a PD$_{out}$ phase correction signal is provided. Detector 33 also provides an output to detector 33' which also receives a control signal from logic 48. The outputs of detector 33' are phase and frequency signals ($\phi$R and $\phi$V) derived from $f_r$ and $f_v$.

Synthesizer 30 also contains a lock detector 55 which receives an input from detector 33 and standby sequence logic 48. Lock detector 55 provides an LD signal which indicates when the $f_r$ and $f_v$ signals are in phase, locked.

The C register (47) is the configuration register and may contain various bits for general control as well as bits related to the present invention. The bits relative to the present invention are designated C4 and C5. The configuration register is defined as follows:

| C7 | C6 | C5 | C4 | C3 | C2 | C1 | C0 |
|----|----|----|----|----|----|----|----|
| —  | —  | LDE | STBY | — | — | — | — | where:

LDE enables/disables the lock detector when not in standby; and forces the LD output to a static high or a static low level when in standby; and STBY places the synthesizer in standby mode or terminates standby mode.

To place synthesizer 30 into standby mode, data is entered into register 47 which sets standby bit C4. This is accomplished using the existing serial programming port and does not require the addition of any dedicated microcontroller unit (MCU) pin or additional circuitry. Also, no external switching of power supply connections is required. When standby occurs, PDout from detector 33 is set to a high impedance state; and $\phi$R and $\phi$V are set to high logic levels. This minimizes disturbances to the VCO during standby.

While in standby, counters 42, 43, and 44 are inhibited from counting by inhibiting their respective clock inputs. However, the data in the associated registers is maintained. This eliminates the need to reprogram the synthesizer when coming out of standby and results in one method of reducing the time required for the VCO to be stabilized.

Also illustrated in FIG. 5 is a pull down termination resistor 60 having a first terminal connected to a signal line conducting signal $f_{in}$, and a second terminal connected to a negative power supply voltage terminal designated "V$_{SS}$".

While in standby, the current, R$_x$, established by an external resistor is shut off; the bias establishing means to amplifier 53 and a pull down termination at $f_{in}$ are broken; and amp 53 gates off the $f_{in}$ signal. This results in a capacitive load being provided at the $f_{in}$ input. A capacitive load is provided to reduce prescaler power consumption since the prescaler may be external to the synthesizer and may not be placed in standby.

While in standby, a means is provided for taking the modulus control output to a level most optimum for system power reduction for the variable modulus prescaler being employed.

In addition, while in standby the state of lock detector 55 is determined by a bit in the C register; and the data in registers 41, 45, and 47 is retained.

The operation of the reference circuit, buffer 51 and control 52, during standby is determined by the input from R register 45 (bits R15, R14, and R13) as follows:

| R15 | R14 | R13 | Reference Circuit |
|---|---|---|---|
| LOW | LOW | LOW | XTAL Mode-shut down, $OSC_{out}$ = static st. |
| LOW | LOW | HIGH | XTAL Mode-active |
| LOW | HIGH | LOW | REF Mode, $REF_{out}$ = static state |
| LOW | HIGH | HIGH | REF Mode, $REF_{out}$ = REFin |
| HIGH | LOW | LOW | REF Mode, $REF_{out}$ = REFin/2 |
| HIGH | LOW | HIGH | REF Mode, $REF_{out}$ = REFin/4 |
| HIGH | HIGH | LOW | REF Mode, $REF_{out}$ = REFin/8 |
| HIGH | HIGH | HIGH | REF Mode, $REF_{out}$ = REFin/16 |

In the first two options the reference circuit is placed in the oscillator mode, whereas in the last six options, the reference circuit is in the reference mode where the reference signal is passed back to the outside after being modified as set out above. These designations will hold regardless of whether synthesizer 30 is in standby mode or not. However, if $REF_{out}$ is set to a static state and synthesizer 30 is in standby mode, then the bias establishing means to buffer 51 is disconnected and buffer 51 gates off. This is determined at buffer 51 through an input from control 52 indicative of the R register input to control 52. This results in a capacitive load being presented at the $REF_{in}$ input. In addition, standby always gates the output of 51 from reaching R counter 44 regardless of the bit values of R13, R14, and R15.

To provide an orderly recovery from standby that minimizes the creation of erroneous error signals to the VCO, the recovery sequence is accomplished in two steps following the receipt at register C of a terminate standby signal. In the first step, the $f_{in}$ bias establishing means and pull down termination are reconnected; amp 53 is gated on; and the Rx current is enabled. At this time the output of buffer 51 is enabled to R counter 44 and, if buffer 51 has been inhibited, it is also enabled. The clock inputs to counters 42, 43, and 44 are enabled and the counters begin counting. However, in the first phase, any $f_r'$ and $f_v'$ signals (outputs from counters 44 and 43) are inhibited from toggling phase detectors 33 and 33' or lock detect 55 by standby sequence logic 48.

In the second step, the system awaits the first $f_v'$ pulse to arrive from counter 43, indicating that counter 43 has completed a cycle. At this point, counter 44 is "jam" loaded with the preset stored in register 45 and the phase and lock detectors (33, 33', and 55) are initialized. The jam load synchronizes counters 42, 43, and 44 and creates outputs $f_r$ and $f_v$ to detector 33 that are in phase and represent the locked VCO condition (no error signal) that existed just prior to going into standby. At this point, the detectors are activated, but their outputs are still inhibited. The outputs are enabled upon the receipt, at standby sequence logic 48, of the first amplified $f_{in}$ signal following the first $f_v'$ signal. This places the detectors in a state such that the next detector output signal is a true representation of any phase difference between the two input signals $f_r$ and $f_v$.

If detector 33 were permitted to start operation without being initialized, the result could be a reversed interpretation of the lead/lag phase relation between $f_r$ and $f_v$ and the creation of erroneous polarity error signals when first exiting from standby, thus extending the time to acquire lock.

The $f_v'$ signal is used to commence phase two of the recovery from standby since the counting of the variable modulus prescaler is not controlled by the standby operation of the synthesizer. However, normal operation of the synthesizer is such that an $f_v'$ signal is only generated at the completion of a prescaler count sequence (but not at the completion of every prescaler count sequence). Thus, $f_v'$ represents a known position of the variable modulus prescaler. Furthermore, $f_v'$, via standby sequence logic 48 and modulus control logic 54, is used to generate a modulus control signal to the prescaler to cause the prescaler to start a new, known, sequence of divide values. This new divide sequence is determined by the data preset into counters 42 and 43. Therefore, when $f_v'$ from counter 43 is received, a known state of the prescaler, as well as counters 42 and 43, is provided. By resetting counter 44 at the same time, detector 33 will have valid information on the next $f_r'$ and $f_v'$ signals. Therefore, at this time, the $f_r$ and $f_v$ inputs to detector 33 are enabled. The output of synthesizer 30 is then made functional on the next $f_{in}$ signal, thereby enabling the PLL frequency synthesizer.

Therefore, a synthesizer has been shown which provides a device and method of standby which saves battery power and avoids delays in reestablishing a signal lock. Additionally, it has been shown that this is accomplished even when a variable modulus prescaler (outside direct control of the standby signal) is employed. Further, it has been shown that, when in standby mode, the standby method provides for control of output lock detect, modulus control, and reference signals; provides capacitive loads for the master reference frequency and prescaler input signals; and that the standby means is accomplished without requiring additional interface connections or power supply line switching to the synthesizer.

Thus, it will be apparent to one skilled in the art, upon reviewing the foregoing description, that there has been provided in accordance with the invention, a process and method that fully satisfy the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A method for placing a frequency synthesizer into standby mode comprising the steps of:
    setting an output of a first phase detector of said synthesizer to a high impedance state;
    inhibiting the counting of a reference counter of said frequency synthesizer in response to a reference signal and a feedback counter of said frequency synthesizer in response to a feedback signal;
    maintaining a preset data in each of a reference register coupled to said reference counter and a feedback register coupled to said feedback counter; and
    inhibiting said reference signal and said feedback signal from being received at said frequency synthesizer.

2. The method of claim 1 further comprising the step of:
    receiving a standby signal at a control logic means for controlling data input to said frequency synthesizer; and
    storing said standby signal in a control register of said frequency synthesizer.

3. The method of claim 1 further comprising the step of setting an output of a second phase detector of said synthesizer to a high logic level.

4. The method of claim 1 wherein said static state of said first phase detector is a high logic level.

5. The method of claim 1 further comprising the step of setting an output of a lock detector of said synthesizer to a static impedance state.

6. The method of claim 1 further comprising the step of setting an output of a lock detector of said synthesizer to a static logic state.

7. The method of claim 1 further comprising the step of inhibiting a reference input signal from being transmitted to said reference counter.

8. The method of claim 1 wherein said step of inhibiting said feedback signal comprises the step of
disconnecting a pull down termination resistor coupled to an input data line carrying said feedback signal to said frequency synthesizer.

9. The method of claim 1 wherein said step of inhibiting said reference signal comprises the step of disconnecting a bias means for biasing a reference signal receiving buffer of said frequency synthesizer from said buffer when a reference control means for controlling a reference output signal of said frequency synthesizer is set to a static state.

10. A method for bringing a frequency synthesizer out of standby mode comprising the steps of:
enabling the receipt of a reference signal at a reference input of said frequency synthesizer and a feedback signal at a feedback input of said frequency synthesizer;
enabling the counting of a reference counter of said frequency synthesizer in response to said reference signal and a feedback counter of said frequency synthesizer in response to said feedback signal;
synchronizing said feedback counter
starting said reference counter; and
initializing a phase detector of said frequency synthesizer.

11. The method of claim 10 wherein said step of synchronizing said reference counter and said feedback counter comprises the steps of:
receiving a signal at a standby logic means for controlling said frequency synthesizer, said signal being received from said feedback counter; and
loading a preset data from a reference register into said reference counter.

12. The method of claim 10 further comprising the step of:
receiving a terminate standby signal at a control logic means for controlling data input to said frequency synthesizer; and
storing said terminate standby signal in a control register of said frequency synthesizer.

13. A method for bringing a frequency synthesizer out of standby mode comprising the steps of:
receiving a terminate standby signal at a control logic means for controlling data input to said frequency synthesizer;
storing said terminate standby signal in a control register of said frequency synthesizer;
enabling a signal input and a feedback input of said frequency synthesizer;
enabling a reference counter and a feedback counter of said frequency synthesizer;
transmitting a signal from said feedback counter to a standby logic means for controlling said frequency synthesizer indicating said feedback counter has completed a count cycle;
loading said reference counter with a preset data from a reference register of said frequency synthesizer; and
initializing said phase detector of said frequency synthesizer.

14. The method of claim 13 wherein said step of transmitting comprises the steps of:
transmitting a first feedback signal to said feedback counter; and
transmitting a signal from said feedback counter to said standby logic means.

15. The method of claim 14 wherein said step of initializing comprises the steps of:
activating said phase detector;
transmitting a second feedback signal to said standby logic means;
sending an enable signal from said standby logic means to said phase detector upon receipt of said second feedback signal; and
enabling an output of said phase detector.

16. A synthesizer having a data input, a reference input, a feedback input, and an output, said synthesizer comprising:
control means for receiving a control signal for said synthesizer, said control means having an input coupled to said data input of said synthesizer and an output;
first register means for storing data, said first register means having an input coupled to said output of said control means and an output;
standby logic means for controlling said synthesizer in entering a standby mode and in terminating said standby mode, said standby logic means having a first input coupled to said output of said first register means, a second input, a third input, a fourth input coupled to said feedback input, a first control output, a second control output, a reference output, and a feedback output;
phase detector means for detecting differences in a reference signal and a feedback signal, said phase detector means having an output coupled to an output of said synthesizer, a control input coupled to said first control output of said standby logic means, a reference input coupled to said reference output of said standby logic means, and a feedback input coupled to said feedback output of said standby logic means;
first counter means for sequentially counting in response to an input reference signal, said first counter means having a reference input coupled to said reference input of said synthesizer, a data input, and an output coupled to said second input of said standby logic means;
buffer means for storing data, said buffer means having a data input coupled to said output of said control means and a data output coupled to said data input of said first counter means;
second register means for storing data, said second register means having a data input coupled to said output of said control means, a first output, and a second output;
second counter means for sequentially counting in response to an input signal, said second counter means having a first input coupled to said first output of said second register means, a second input coupled to said feedback input of said synthesizer, and an output;

third counter means for sequentially counting in response to an input signal, said third counter means having a first input coupled to said second output of said second register means, a second input coupled to said feedback input of said synthesizer, a first output, and a second output coupled to said third input of said standby logic means; and modulus control logic means for controlling a prescaler, said modulus control logic means having a first input coupled to said output of said second counter means, a second input coupled to said first output of said third counter means, a third input coupled to said second control output of said standby logic means, and an output.

* * * * *